United States Patent
Haller et al.

(10) Patent No.: US 6,572,954 B1
(45) Date of Patent: Jun. 3, 2003

(54) ELECTROMECHANICAL COMPONENT

(75) Inventors: Hans-Otto Haller, Niedereschach (DE); Volker Strubel, Freiburg (DE)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 09/830,304
(22) PCT Filed: Nov. 3, 1999
(86) PCT No.: PCT/EP99/08401

§ 371 (c)(1),
(2), (4) Date: Apr. 25, 2001

(87) PCT Pub. No.: WO00/27171

PCT Pub. Date: May 11, 2000

(30) Foreign Application Priority Data

Nov. 4, 1998 (DE) .......................................... 198 50 737
Jan. 15, 1999 (DE) .......................................... 199 01 262

(51) Int. Cl.⁷ ................................................. B32B 3/00
(52) U.S. Cl. ....................... 428/209; 428/901; 174/254; 174/258; 174/259; 521/51
(58) Field of Search ................................. 428/209, 901; 174/258, 259, 254; 521/51

(56) References Cited

U.S. PATENT DOCUMENTS

| | | | |
|---|---|---|---|
| 3,608,008 A | * 9/1971 | Soukup et al. | 264/45 |
| 3,836,424 A | * 9/1974 | Reymore, Jr. et al. | 161/159 |
| 4,031,313 A | 6/1977 | Franz et al. | 174/68.5 |
| 4,774,126 A | 9/1988 | Dorsey et al. | 428/209 |
| 5,304,579 A | * 4/1994 | Hara et al. | 521/51 |

FOREIGN PATENT DOCUMENTS

| | | | |
|---|---|---|---|
| DE | 2413158 | 10/1974 | ............ H01B/3/02 |
| DE | 3805120 | 8/1989 | ............ H05K/1/03 |
| EP | 0364416 | 4/1990 | ............ H05K/7/18 |
| FR | 2260171 | 8/1975 | ............ H01B/5/14 |
| FR | 2455616 | 11/1980 | .............. C08J/7/04 |
| FR | 2525849 | 10/1983 | ............ H05K/1/03 |
| GB | 2057351 | 4/1981 | ........... B32B/27/06 |
| GB | 1468065 | 3/1997 | ........... B32B/13/02 |
| WO | 95/11129 | 4/1995 | ............. B32B/7/12 |

OTHER PUBLICATIONS

W. Schmidt et al "Neue Dimensionen in der Leiterplattentechnik", Feinwerktechnik + Messtechnik, Bd. 102, Nr. 5/6, May 1994, pp. 219–225.

"Dreidimensionale Platinen aus einem Guss", Elektronik, Bd. 40, Nr. 12, Nov. 12, 1991, pp. 142–149.

* cited by examiner

*Primary Examiner*—Cathy Lam
(74) *Attorney, Agent, or Firm*—Joseph S. Tripoli; Reitseng Lin

(57) ABSTRACT

The invention relates to an electromechanical component which is configured as a sandwich-type structure. In the interior of said structure, a support layer consisting of foamed plastic is arranged. Said support layer is placed between covering layers which consist of compact materials. All layers are produced from hardly inflammable plastic material, for example LCP or PEI plastics so that it is not necessary to add any flame-retardant additives. The component can be configured in the shape of a slab but it can also have a more complex three-dimensional structure and can optionally be provided with mechanical functional elements. Accordingly to an aspect of the invention, the support layer of the component can consist of silicone. The composition of the inventive component provides a means for simplifying recycling a product at the end of its lifetime.

14 Claims, 3 Drawing Sheets

ELECTROMECHANICAL COMPONENT

Figure 1:
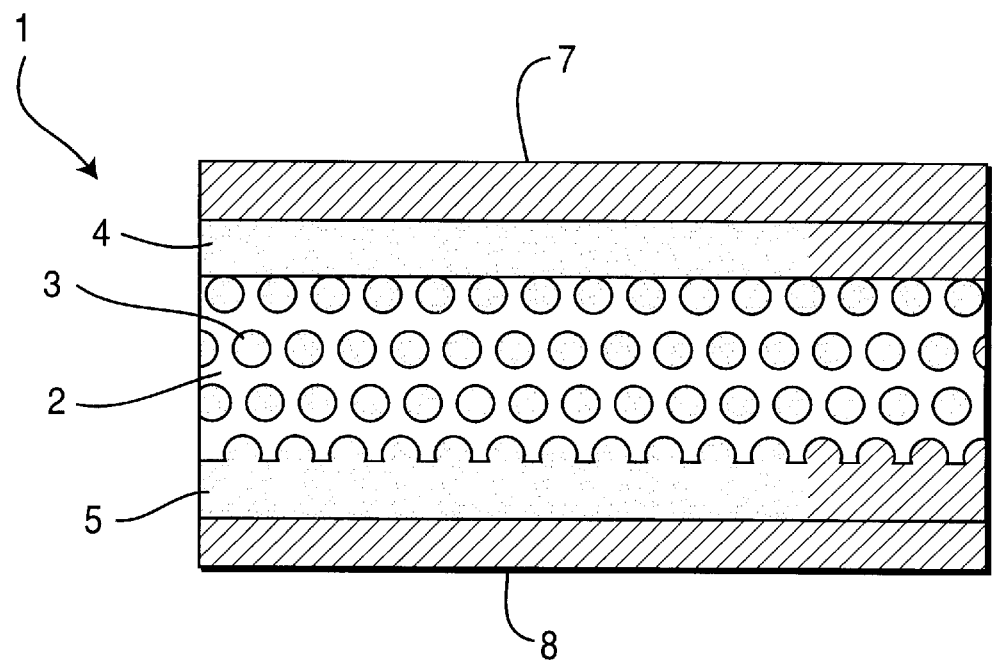

This application claims the benefit of German application serial no. 19850737.2 filed Nov. 4, 1998 and German application serial no. 19901262.8 filed Jan. 15, 1999, which are hereby incorporated herein by reference, and which claims the benefit under 35 U.S.C. §365 of International Application PCT/EP99/08401, filed Nov. 3, 1999, which was published in accordance with PCT Article 21(2) on May 11, 2000 in German.

The invention relates to an electromechanical component, particularly a component according to the preamble of claim 1.

In the electrotechnical industry, use is made for numerous applications of printed circuit boards which, firstly, serve the purpose of holding electronic components mechanically and, secondly, simultaneously produce electric connections between these components. Conventional printed circuit boards are frequently produced from hot-cured materials such as, for example, anionic resin paper or epoxy resin reinforced with glass fibres. These materials are combustible per se, and this is not acceptable for safety reasons. Consequently, these materials have flame-retardant chemicals added to them such as, for example, bromine compounds or organic phosphorous compounds which, in co-operation with other inorganic substances such as, for example, antimontrioxide as synergist, avoid the flammability of conventional printed circuit boards.

The flame-retardant additives in the printed circuit boards give rise, however, to substantial difficulties in the recycling of the printed circuit boards. In particular, the hot-curable materials cannot be recycled and must therefore finally disposed of in refuse dumps. Furthermore, it is possible to burn these materials, in which case substantial efforts are required in order to avoid toxic emissions which stem from the flame-retardant chemicals. For these reasons, there are relatively high costs for the removal at the end of the service life of a product which contains conventional printed circuit boards. With regard to the general trend towards a sustained economic approach, it is therefore desirable to provide components for electrotechnical applications which can be recovered with an acceptable economic outlay at the end of the service life of a product.

DE 24 13 158 A describes a punchable and drillable flame-retardant insulating plate for electrotechnical aims, which is produced from inorganic fibrous material, inorganic binder and inorganic filler as well as a heat-curable resin. The inorganic materials are not combustible whereas the organic resin is combustible. This insulating plate is a multi-component system.

Starting from here, it is the object of the invention to create a component for electrotechnical applications which avoid the disadvantages described at the beginning.

According to the invention, this object is achieved by means of a component according to claim 1. The component has a support layer, at least the top side of the support layer being covered by a covering layer. Both the covering layer and the support layer are produced from a relatively non-combustible plastic material. The covering layer and the support layer are permanently connected to one another and lend the component mechanical stability which suffices for the respective application. Furthermore, the covering layer bears electrically conducting material by means of which—after a further structuring process, if appropriate—it is possible to produce electrical connections between electronic components.

The particular advantage of this component resides in the fact that the flame-retardant properties are achieved without additives which show up difficulties in recycling at the end of the service life of a product.

According to an exemplary embodiment of the invention, the covering layer can be constructed in a multilayer fashion from a plurality of layered films. This design is particularly advantageous wherever two or more of these films bear a conductor track structure, each plane of a conductor track structure being separated spatially from an adjacent plane by an electrically insulating film. If required, electric connections can also be produced between the planes.

In accordance with a first exemplary embodiment of the invention, the electrically conducting material is formed as a layer which completely covers the covering layer. This layer can, for example, consist of a thin layer of copper which is structured in conductor tracks using an etching technique. As an alternative thereto, the conductor tracks can also be produced using a hot embossing process or a selective chemical electroplating process.

However, it is also possible for the conductor tracks to be produced from a free-flowing material using a printing process, in particular a screen printing technique.

It is particularly advantageous when the covering layer is produced from LCP plastic material (Liquid Crystal Plastic) or polyetherimide (PEI). These materials are intrinsically flame-retardant and easy to recycle.

The support layer can expediently be produced from foamed plastic material. This has the advantage that the component is lighter as a whole, adequate mechanical stability simultaneously being achieved. Moreover, the foaming of the plastic leads to a saving in material, and so the costs for the component are comparable to the costs of a part which is produced from conventional material. However, it is also possible to produce the support layer from silicone, which permits a particularly cost effective application.

It is particularly advantageous when the covering layer is of flexible design such that the component can be deformed, for example when being mounted in an electrical device. The mechanical stability required of electric components during mounting can be achieved by virtue of the fact that the flexible covering layer is reinforced with a support layer in the regions specified for holding components, while the rigid support layer is lacking in the regions which are to remain flexible.

According to an exemplary embodiment of the invention, the component can be of flat design in the form of a printed circuit board. However, it is also possible for the component to have a three dimensional structure and be provided with mechanical functional elements. These mechanical functional elements can serve the purpose, for example, of holding heavy electronic components such as, for example, capacitors or transformers on the component without the need for additional fastening elements. Furthermore, the component can be designed such that it fulfils at least partly the purpose of an insulating housing for an electric device.

A further object of the invention is to specify a method in accordance with which the component according to the invention can be produced in a particularly favourable way.

This object is achieved by a method according to claim 18.

Figure 2:
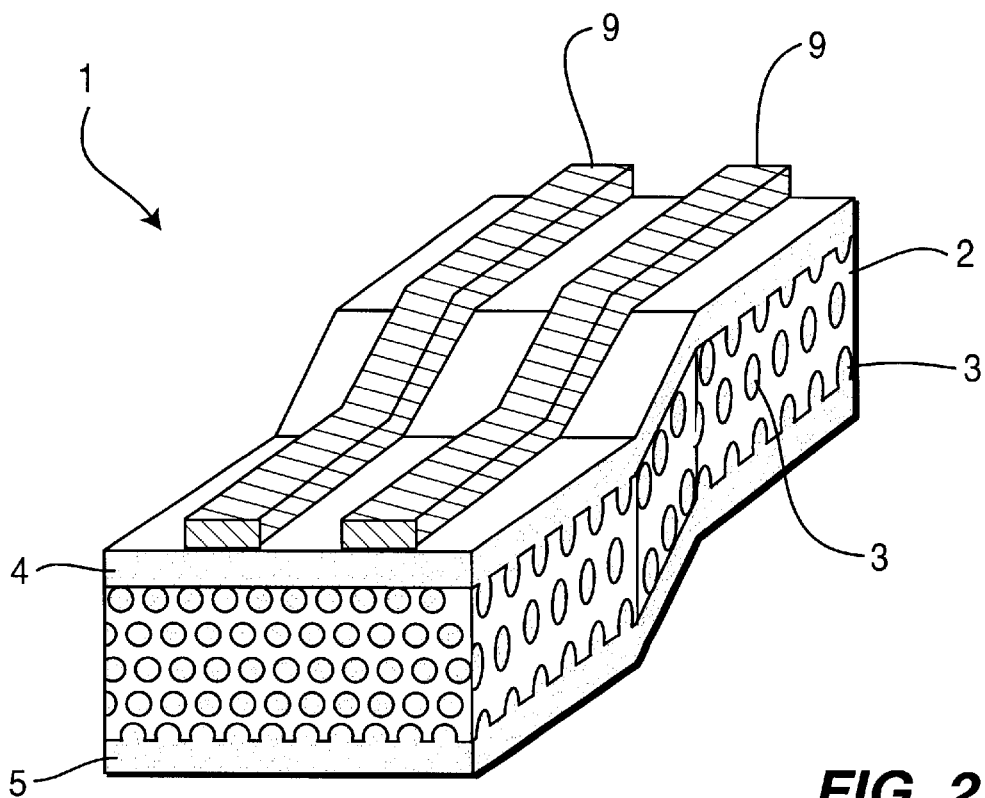
Figure 3:
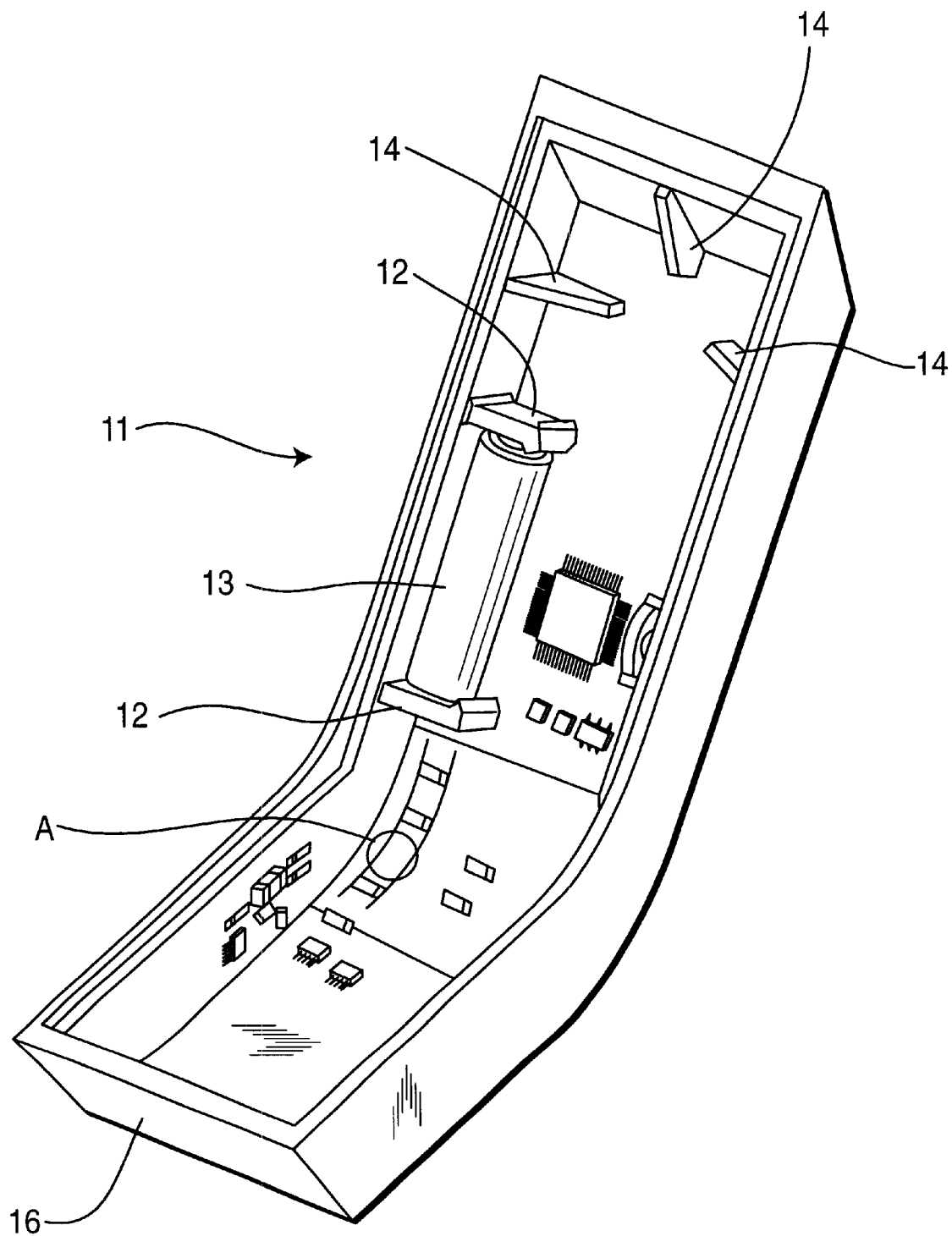
Figure 4A:
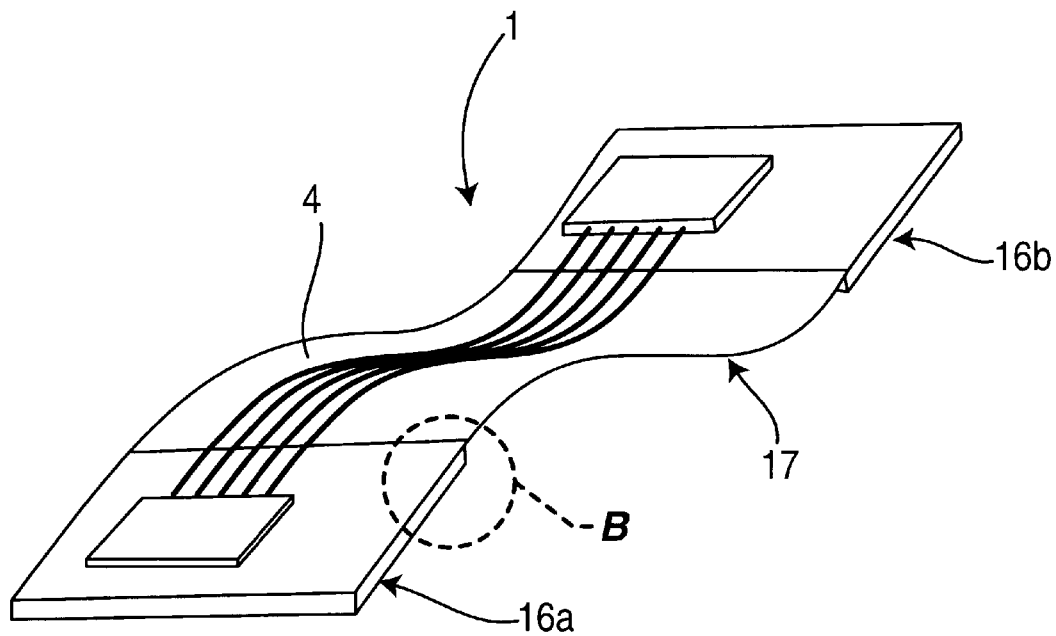
Figure 4B:
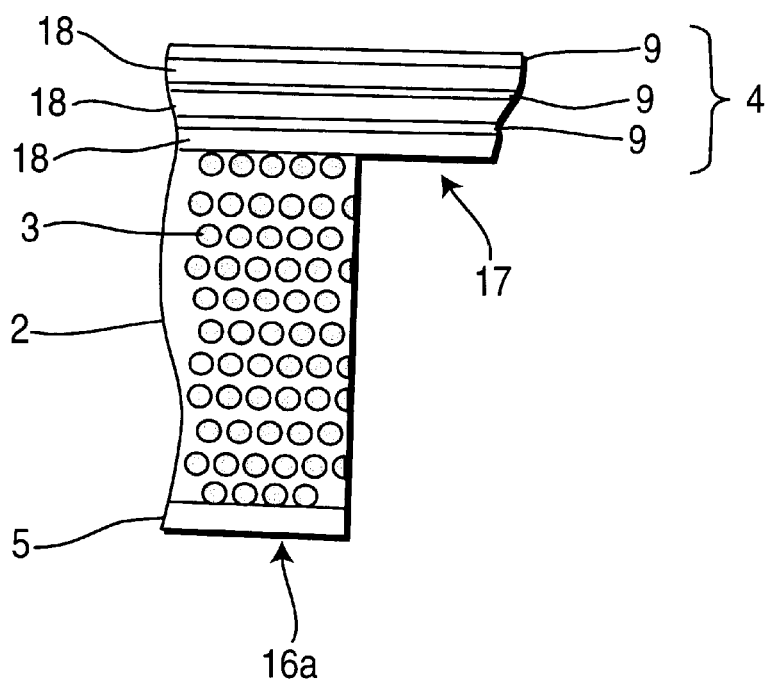

Exemplary embodiments of the invention are illustrated in the drawing, the same numerals being used for parts which are identical or correspond to one another. In the drawing:

FIG. 1 shows a component according to the invention which is of flat design;

FIG. 2 shows an excerpt from a component according to the invention which has a complicated spatial form FIG. 3 shows an exemplary embodiment of a component according to the invention, which is provided with mechanical functional elements, FIG. 4a shows an exemplary embodiment of a component according to the invention which has both rigid and flexible regions and FIG. 4b shows an excerpt from FIG. 4a.

The component 1 according to the invention and formed as a flat plate is illustrated in cross-section in FIG. 1. Arranged in the interior of the component 1 is a support layer 2 which is produced from foamed LCP plastic material. The foamed support layer 2 contains gas bubbles 3, so the need for relatively expensive LCP plastic material is substantially reduced, and this also has a favourable effect on the production costs and the weight of the component 1. An upper covering layer 4 and a lower covering layer 5, which can respectively bear an upper copper layer 7 and a lower copper layer 8, respectively, are connected by adhesive bonding to the support layer 2. The copper layers are formed over the entire surface, and so they can be structured, for example by photochemical etching techniques, for the respective application, with the formation of conductor tracks.

It is evident that the component can have conductor tracks on the upper covering layer 4 or on the lower covering layer 5, or on both covering layers. Consequently, it is also possible to produce the component 1 with only a single copper layer. The mechanical stability of a component 1 according to the invention corresponds approximately to that of conventional printed circuit boards. A predetermined thickness must be observed for the component 1 to be able, for example, to replace conventional FR4 printed circuit board material. Moreover, however, the mechanical properties of the component can be adapted to the respective application by suitable selection of the dimensions of the covering layer(s) and of the support layer. It is also possible to provide only a single covering layer 4 or 5.

As alternative to this, it is also possible for the copper layers 7 and 8 to be structured using a hot-embossing process. Furthermore, the conductor track structures can be printed onto the covering layer by using a screen printing technique, for example with the aid of conductive silver paste. Finally, it is also possible for the conductor tracks to be deposited using a selective chemical electroplating process. Such processes are known from the prior art.

It is also possible not only to give the component 1 a plate-shaped configuration, but also to lend it a complicated spatial structure, as is illustrated in FIG. 2. FIG. 2 shows an excerpt from a component with a three dimensional structure. Conductor tracks 9 are already structured on the upper covering layer 4. It can clearly be seen both in FIG. 1 and in FIG. 2 that the component according to the invention has a sandwich structure.

Such components can be adapted to a specific form of device and already have mechanical functional elements. These functional elements serve, for example, to hold large and heavy electronic components, and at the same time take over the function of a housing for the electric device.

An example of such a component 1 as a telephone receiver 11 for a mobile telephone is shown in FIG. 3. A mobile telephone requires a relatively large quantity of electronics in the receiver, and this must be wired up, on the one hand, and held mechanically, on the other hand. Components which fulfils this purpose are also denoted as MID (Moulded Interconnect Devices) components. In the case of the illustrated telephone receiver 11, holding clips 12, for example, are provided in order to hold a battery 13 securely. Also present are reinforcing ribs 14, for the purpose of lending the telephone receiver 11 adequate mechanical stability. Moreover, the outside 16 of the telephone receiver 11 is configured so as to achieve an exterior which appeals to the user optically and haptically. It may be stressed that all these functions are fulfilled simultaneously by a single component. For illustrative purposes, the spatial position of the excerpt illustrated in FIG. 2 is indicated at the reference symbol A.

Finally, it is also possible to design the component according to the invention such that it can, for example be bent for mounting in a device. FIG. 4a shows an exemplary embodiment of such a component, which has a flexible region 17 between two rigid regions 16a and 16b. The rigid regions are suitable, for example, for holding electronic components. The electronic components can be soldered on or bonded on in a conventional way. However, it is also possible for chips with electronic circuits to be bonded directly onto the component 1, as is known, for example, from the chip-on-board technology. Conductor tracks 9 produce electric connections between the electronic components.

An excerpt from FIG. 4a denoted by the reference symbol B is shown in FIG. 4b. This excerpt illustrates how the transition between the rigid region 16a and the flexible region 17 is produced. In the rigid region 16a, the covering layer 4 is reinforced by the support layer 2, while no support layer 2 is present in the flexible region. The covering layer 4 is flexible, and so the component 1 can be bent along the region 17, for example when being installed in a device. The support layer 2 is provided on the side situated opposite the conductor tracks 9 with a lower covering layer 5, which can, also be omitted.

In the exemplary embodiment illustrated in FIG. 4b, the covering layer 4 is produced from films 18 which are layered one above another and in each case bear conductor tracks 9, and so it is possible to produce multilayer printed circuit boards. Depending on whether the support layer 2 extends over the entire surface of the covering layer 4, it is therefore possible to produce both rigid and rigid/flexible components with a plurality of conductor levels.

The component described so far is produced in the following way:

Using an injection moulding process, the plastic material is injected into a mould and expanded in the mould, that is to say foamed. By observing particular temperature conditions at the foundry mould surface, the foamed material collapses in a region bordering the foundry mould, in which case the covering layers 4 and 5, which contain no gas bubbles 3, are formed. Both plate-shaped components and MID components can be produced using this method. Depending on the dimensions of the foundry mould, it is also possible to use this method to produce the rigid/flexible printed circuit board shown in FIGS. 4a and 4b. In this case, the foundry mould is selected such that the layer thickness is selected to be so small in the regions which are to be flexible that an LCP layer without the gas bubbles 3 is produced during the injection moulding, whereas LCP material is foamed, as described above, in the rigid regions 16a and 16b. The thin LCP layer forms the flexible region 17 of the component.

It is, however, also possible to bond the covering layer 4 behind with foamed LCP material as support layer 2, in order to produce the rigid regions 16a and 16b. The regions of the covering layer 4 which are not bonded then remain flexible.

In addition to the abovementioned LCP plastic material, its is also possible to use other high temperature thermoplastics which are intrinsically flame-retardant, for example polyetherimide (PEI). Proposed plastic materials are intrinsically flame-retardant according to the standard UL94VO.

A particular advantage of the components produced in this way is that they consist of a single sorted plastic material and require no flame-retardant additives, and so it is possible to recycle these components in a particularly simple way.

According to an alternative exemplary embodiment of the invention, the support layer 2 of the component 1 is produced from silicone. Just like the abovementioned plastic materials, silicone is intrinsically flame-retardant, and so flame-retardant additives can be avoided. In order to achieve satisfactory mechanical stability of the component, however, it is necessary for the covering layers further to consist of a high temperature thermoplastic synthetic material. It is true that the component is thereby no longer produced from a single sorted plastic material, but, because of the favourable material costs for silicone, it is possible, viewed overall, for there to be a cost advantage for specific applications as compared with foamed components from sorted plastic.

The component with a support layer 2 made from silicone is produced in such a way that an adequate amount of silicone is applied by means of screen printing to a lower covering film. A second covering film is laid thereupon, two covering films being held at a constant spacing during the curing of the silicone layer. The covering films form the covering layers 4, 5 illustrated in FIGS. 1 and 2, and can in the case of this method already be covered on one or two sides with a copper layer.

All the embodiments of the invention have the advantage that they can replace conventional printed circuit board material without the need to change production and processing methods proven therefore. Regarding the components with a support layer made from silicone, this also holds for interfacial connection from one side of the component to the other with the aid of standard plating methods or the application of conductive silver paste. It is to be noted by way of restriction in this case for the components with a foamed support layer that the gas bubbles 3 in the support layer 2 may be only so large that it is still possible to produce a reliable connection through a plated-through hole.

What is claimed is:

1. Electromechanical component which has at least one support layer with a top side and an underside, at least one of these sides being covered by a covering layer which is permanently connected to the support layer, the covering layer bearing electrically conducting material, characterized in that the covering layer and the support layer are produced from a single relatively non-combustible plastic material.

2. Electromechanical component which has at least one support layer with a top side and an underside, at least one of these sides being covered by a covering layer which is permanently connected to the support layer, wherein the covering layer bears electrically conducting material, and wherein the covering layer and the support layer are produced from a relatively non-combustible plastic material, characterized in that the support layer is produced from foamed plastic material.

3. Component according to claim 2 characterized in that the covering layer is constructed in a multi layer fashion from a plurality of films.

4. Component according to claim 2 characterized in that the electrically conducting material is formed as a layer on the covering layer.

5. Component according to claim 3, characterized in that at least two of the films bear electrically conducting material, the films being arranged such that the electrically conducting material is arranged in a plurality of planes, the films being situated as an electric insulator between the electrically conducting material.

6. Component according to claim 2 or 5 characterized in that the electrically conducting material is structured in the form of conductor tracks.

7. Component according to claim 2 characterized in that liquid crystal plastic (LCP) material or polyetherimide (PEI) are used as the relatively non-combustible plastic.

8. Component according to claim 2 characterized in that the covering layer is connected to the support layer by adhesive bonding.

9. Component according to claim 2 characterized in that the covering layer is a flexible layer.

10. Component according to claim 9, characterized in that the surface area of the support layer is smaller than the surface area of the covering layer.

11. Component according to claim 2 characterized in that the component is covered by an upper covering layer and a lower covering layer.

12. Component according to claim 2 characterized in that the component is of flat design in the form of a printed circuit board.

13. Component according to claim 2 characterized in that the component is a three dimensional structure and is coupled with mechanical elements.

14. Method for producing a component according to one of the preceding claims, in which a plastic material is injected into a mould and the plastic material in the mould is subsequently expanded in such a way that a foamed plastic material is produced forming the support layer and that the foamed material collapses adjacent to the mould surface forming the covering layers containing no gas bubbles.

* * * * *